United States Patent
Amor, Sr. et al.

(10) Patent No.: US 6,208,141 B1
(45) Date of Patent: Mar. 27, 2001

(54) METHOD AND APPARATUS FOR MOUNTING GRADIENT TUBE TO DIAGNOSTIC IMAGING DEVICE

(75) Inventors: William H. Amor, Sr., Chagrin Falls; Jerome S. Alden, Sr., Aurora; Michael A. Morich, Mentor; James L. Gruden, Kirtland Hills, all of OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/096,111

(22) Filed: Jun. 11, 1998

(51) Int. Cl.[7] ............................. G01R 33/20; G01V 3/00
(52) U.S. Cl. ..................... 324/318; 324/309; 324/307
(58) Field of Search .................................. 324/300–322; 600/410, 422

(56) References Cited

U.S. PATENT DOCUMENTS

| | | | |
|---|---|---|---|
| 5,337,001 | * | 8/1994 | McDougall et al. .................. 324/318 |
| 5,457,387 | * | 10/1995 | Patrick et al. ......................... 324/318 |
| 5,786,695 | * | 7/1998 | Amor et al. ........................... 324/320 |
| 5,793,210 | * | 8/1998 | Pla et al. ................................ 324/318 |
| 5,990,681 | * | 11/1999 | Richard et al. ....................... 324/318 |
| 6,084,409 | * | 7/2000 | Zebelein et al. ...................... 324/318 |

FOREIGN PATENT DOCUMENTS

3833590A1 * 4/1990 (DE) .

* cited by examiner

*Primary Examiner*—Christine K. Oda
*Assistant Examiner*—Tiffany A. Fetzner
(74) *Attorney, Agent, or Firm*—Fay, Sharpe, Fagan, Minnich & McKee, LLP (57) ABSTRACT

A diagnostic imaging apparatus such as a magnetic resonance imaging (MRI) device includes a vacuum vessel (24) having a central helium reservoir (16) in which superconducting magnetic coil windings (10) are maintained at a superconducting temperature. The vacuum vessel defines a bore (12) within which a gradient tube assembly (30) and an RF coil (32) are received. The gradient tube assembly includes an integral tongue (66) extending from a patient end (48) thereof. A first constraint (70) retrains the gradient tube assembly in a "push-pull" arrangement in both directions along the z-axis. The constraint (70) is mounted to a patient-end of the vessel (24) at a lowermost (i.e., six o'clock) position. The constraint includes vibration isolators (94) interposed between the tongue and a saddle mount (72) to reduce vibration transmission from the gradient tube assembly to the vessel. A second constraint (104) and a third constraint (106) are positioned at the twelve-o'clock positions at the patient-end and service-end, respectively of the vessel. The constraints (104, 106) restrain the gradient tube assembly in directions along the x and y-axes. Each constraint (104, 106) includes at least one elastomeric plug (118) and means for expanding the plug along the x and/or y-axis to wedge the plug between the gradient tube assembly and a cylindrical housing member (26) defining the bore (12).

22 Claims, 10 Drawing Sheets

METHOD AND APPARATUS FOR MOUNTING GRADIENT TUBE TO DIAGNOSTIC IMAGING DEVICE

BACKGROUND OF THE INVENTION

The present invention relates to the magnetic resonance art. It finds particular application in conjunction with a method and apparatus for mounting a gradient tube to a magnetic resonance imaging (MRI) device and will be described with particular reference thereto. However, it should be appreciated that the present invention may also find application in conjunction with magnetic resonance spectroscopy systems and other applications which utilize gradient tubes.

In magnetic resonance imaging applications, three orthogonal gradient fields are employed to provide spatial resolution by frequency discrimination of an MRI signal. A gradient tube typically includes three discrete gradient coils for generating the x, y, and z-gradient fields. The discrete coils are insulated from each other and are layered on a cylindrical former. Commonly, the entire gradient tube is overwrapped and epoxy impregnated for greater structural strength.

A self-shielded gradient tube typically includes a secondary or shielding gradient coil set spaced radially from a primary gradient coil set. The primary and secondary gradient coil sets each include insulated coils for generating x, y, and z-gradient fields which can be layered on separate cylindrical formers or on a single unitary former.

Both types of gradient tubes must be constrained in the x, y, and z directions when mounted within the cylindrical bore of an MRI magnet housing due to the magnetic forces acting on the gradient tube. The gradient tube is typically secured to the magnet housing by mounting rings positioned at both ends of the cylindrical bore to, in effect, trap the gradient tube between the mounting rings. However, the mounting ring design makes the front tunnel liner design much more claustrophobic from the patient's perspective, in addition to limiting access to the patient by medical personnel. Further, mounting rings interfere with service-end water headers on liquid-cooled gradient tubes making the designs complex and costly.

In an alternative arrangement, the gradient tube can be mounted to tombstone-like castings secured to the floor and located at the patient and service-ends of the magnet housing. However, the tombstone gradient tube mounts make the MRI device substantially longer, making access to the patient more difficult.

The present invention contemplates a new and improved method and apparatus for mounting a gradient tube to an MRI device which overcomes the above-referenced problems and others.

SUMMARY OF THE INVENTION

In accordance with one aspect of the present invention, there is provided a diagnostic imaging apparatus including a housing, a main field magnet for generating a temporally constant magnetic field through an examination region defined within a bore of the housing, and a gradient tube assembly positioned within the bore for inducing gradient magnetic fields across the temporally constant magnetic field. The gradient tube assembly includes at least one tongue member extending from the gradient tube assembly, and at least one mount for securing the at least one tongue member to the housing, said mount restraining the gradient tube assembly in a direction at least along a z-axis extending through the bore.

In accordance with a second aspect of the present invention, there is provided a method of securing a gradient tube assembly to a housing of a diagnostic imaging apparatus wherein the gradient tube assembly is positioned within a bore of the housing. The method includes attaching a tongue member associated with the gradient tube assembly to a mount associated with the housing to restrain the gradient tube assembly in a direction at least along a z-axis extending through the bore.

The invention provides a low cost gradient mounting with improved patient access due to larger openings in the tunnel liners. There is also much better service access to the service-end of the gradient tube for the bus bars and water header plumbing with the z-axis constraint located at the patient-end of the gradient tube.

One advantage of the present invention is that it provides a single "push-pull" type z-axis constraint at the patient end of the bore to permit free and needed space to be used at the service end of the bore for water cooling, electrical connections, etc.

Another advantage of the present invention is the provision of an integral mounting appendage or tongue at the patient-end of the gradient tube which is structurally reinforced by continuous glass filaments and of an optimized semi-circular shape.

Another advantage of the present invention is that it allows for a more open front tunnel linear design with a shorter bore length for easier access to the patient.

Another advantage of the present invention is that it reduces the cost of the gradient mounting and simplifies the design and installation of the gradient tube.

Further advantages reside in improved service access to the service end of the gradient tube for servicing the bus bars and water header plumbing.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
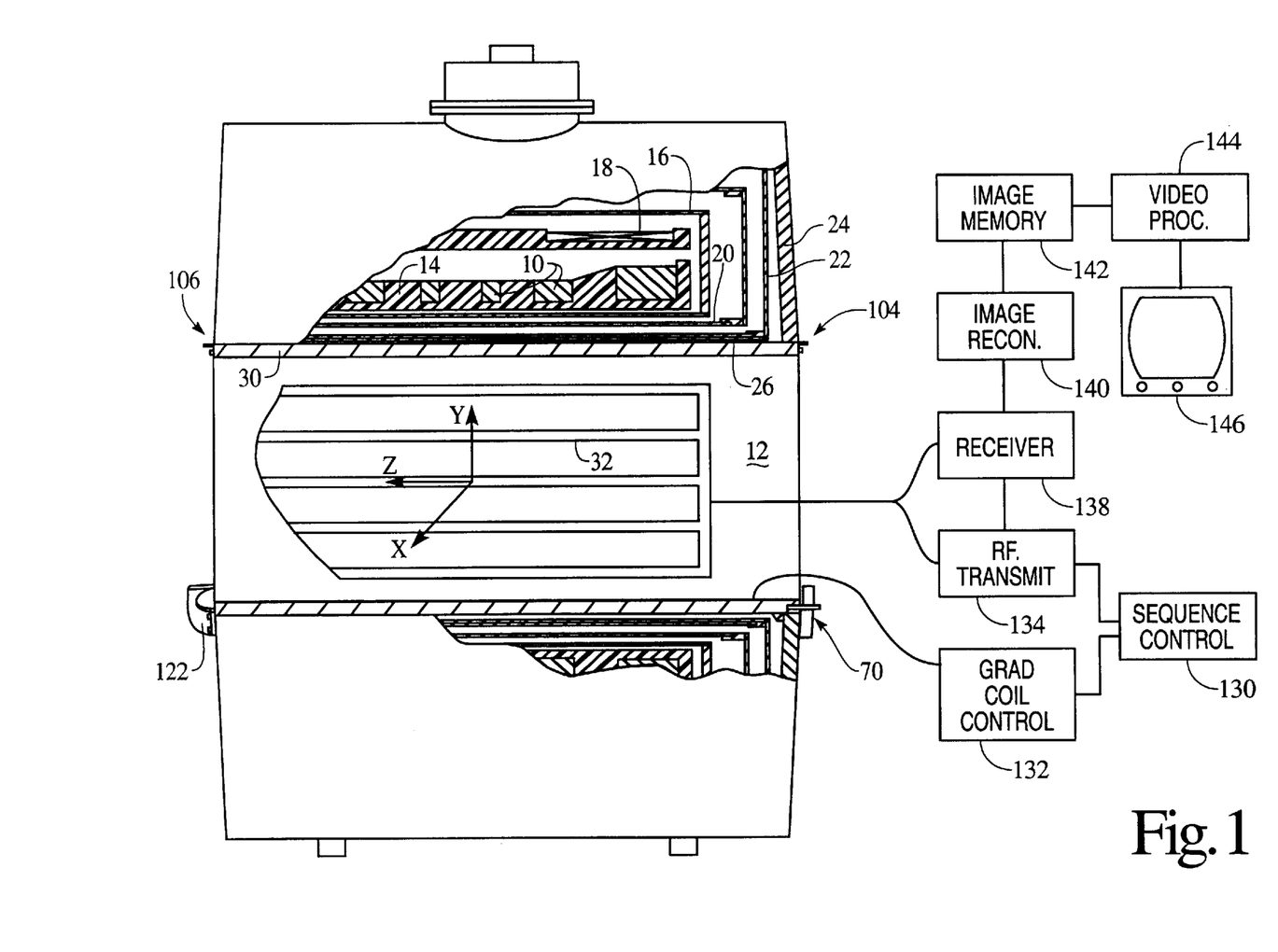
FIG. 1 is a diagrammatic illustration of a gradient tube mounted to a magnetic resonance imaging (MRI) system in accordance with the present invention.

With reference to FIG. 1, a plurality of superconducting magnetic field coils 10 generate a temporally constant magnetic field along a longitudinal or z-axis of a central bore 12. The x and y-axes are defined orthogonal to the z-axis and to each other, e.g. horizontally and vertically. The coils of the superconducting magnet are supported by a former 14 and are received in a toroidal helium vessel or can 16. The helium vessel is filled with liquid helium to maintain the superconducting magnet at a temperature at which it is superconducting. A main magnetic field shield coil assembly 18 shields regions surrounding the superconducting magnet from the full strength of the main magnetic field.

To reduce helium boil-off, the toroidal helium vessel 16 is surrounded by a first cold shield 20 which is maintained at about 20° K. or less. A second cold shield assembly 22 is chilled to about 60°–70° K. or less. The first and second cold shields are preferably cooled by mechanical refrigeration (not shown). A toroidal vacuum vessel or housing 24 encases the cold shields to define a vacuum reservoir therearound. The vacuum vessel 24 includes a cylindrical member 26 that defines the bore 12 and extends parallel to the z-axis. The main magnetic field is generated through the cylindrical member 26.

An exemplary gradient tube assembly 30 is positioned within the bore 12 and is mounted to the housing 24 in accordance with the present invention. A plurality of elastomeric (e.g., urethane rubber) pads 31 are spaced along the lower exterior surface of the gradient tube assembly to support the gradient tube assembly on the cylindrical member 26 when positioned within the bore 12. The thickness of the pads 31 can be sized so as to substantially center the gradient tube assembly 30 within the cylindrical member 26. A radio frequency (RF) coil assembly 32 is positioned within the gradient tube assembly 30. The radio frequency coil assembly can include a quadrature or birdcage-type radio frequency coil and a radio frequency shield.

The gradient tube assembly 30 can be self-shielded including a set of primary x, y, and z-gradient coils and a set of shielding x, y, and z-gradient coils. Alternatively, the gradient tube assembly 30 can be non-shielded including only primary x, y, and z-gradient coils. Further, the gradient tube assembly 30 can have a unitary or single former construction such as described in co-pending U.S. patent application Ser. No. 08/908,359 which is commonly assigned to the Assignee of the present invention. The gradient tube assembly 30 can also have a dual former construction (in the case of a self-shielded gradient coil assembly) such as described in co-pending U.S. patent application Ser. No. 08/822,766 which is also commonly assigned to the Assignee of the present invention.

Figure 2:
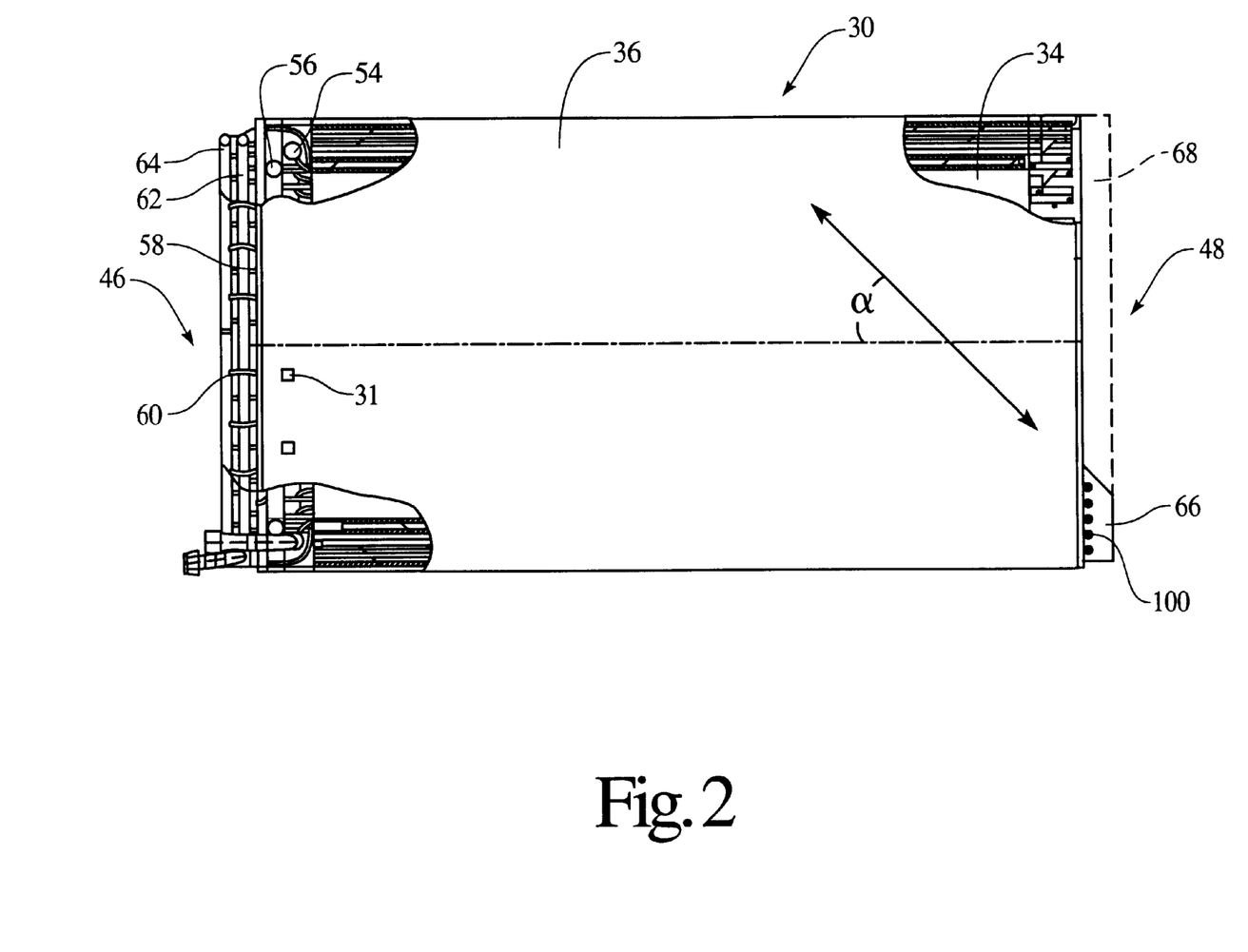
FIG. 2 is side elevation view, partially cut-away of the gradient tube of FIG. 1.
Figure 3:
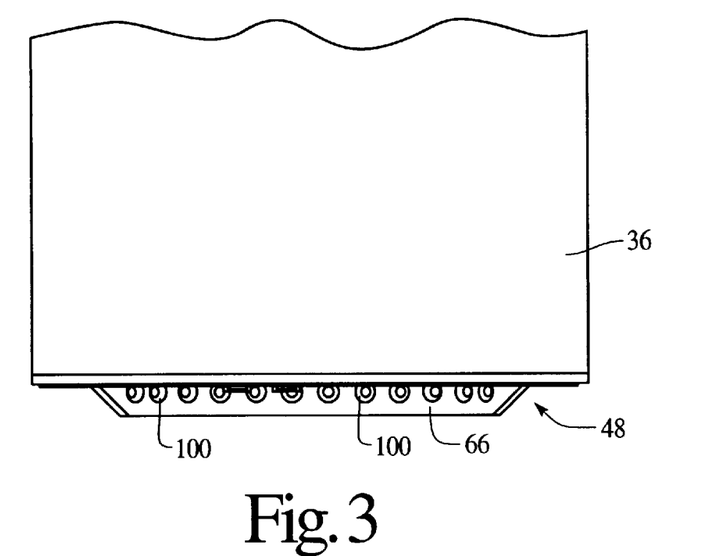
FIG. 3 is a top view of a patient-end of the gradient tube of FIG. 2.
Figure 4:
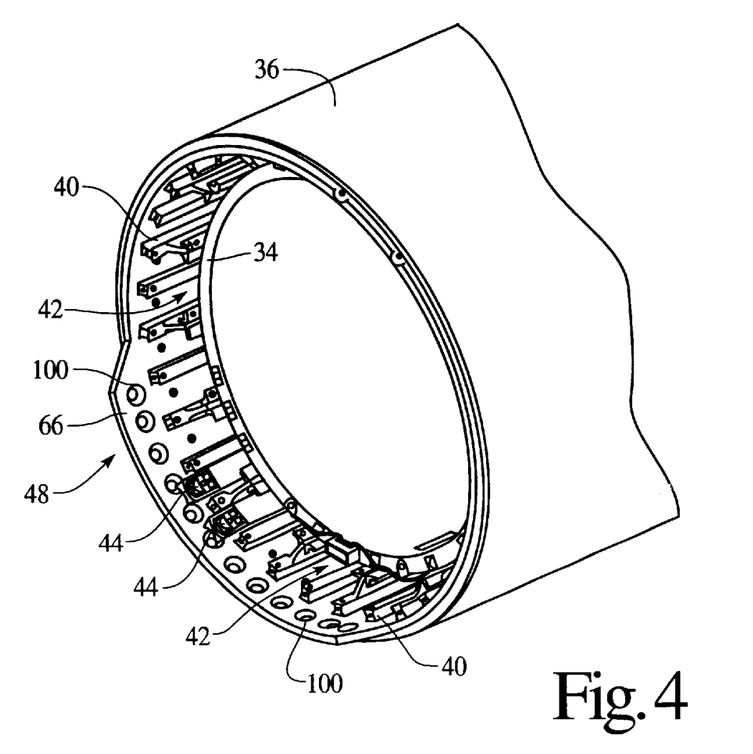
FIG. 4 is a perspective view of the patient-end of the gradient tube of FIG. 2.

With reference to FIGS. 2–4, an exemplary self-shielded, dual former, gradient tube assembly 30 is shown and hereafter described. However, various alternate gradient tube constructions are contemplated. The gradient tube assembly 30 includes a primary gradient tube 34 having a set of primary x, y, and z-gradient coils wrapped over a former and potted in an epoxy or other dielectric material. A secondary gradient tube 36 has a set of shielding x, y, and z-gradient coils also wrapped over a former and potted in an epoxy or other dielectric material.

The primary and secondary x and y-gradient coils can be fingerprint-type coils as illustrated in greater detail in U.S. Pat. No. 5,296,810 which issued to Morich on Mar. 22, 1994, and assigned to the same Assignee as the present invention. The elastomeric pads 31 are located at positions on the external surface of the secondary gradient tube 36 where there are no gradient coils (i.e., in the "cold gaps" between the windings of the gradient coils) to keep the heat to a minimum. Excess heating of the pads can cause a loss of support due to reduced durometer (stiffness).

The secondary gradient tube 36 is spaced concentrically apart from the primary gradient tube 34 to define an annular gap therebetween. A plurality of longitudinally extending I-beams or other mounting brackets 40 are circumferentially spaced-apart within the annular gap. Adjacent I-beams 40 define passages 42 of sufficient size to receive lower order magnetic field shim set trays 44.

Figure 11:
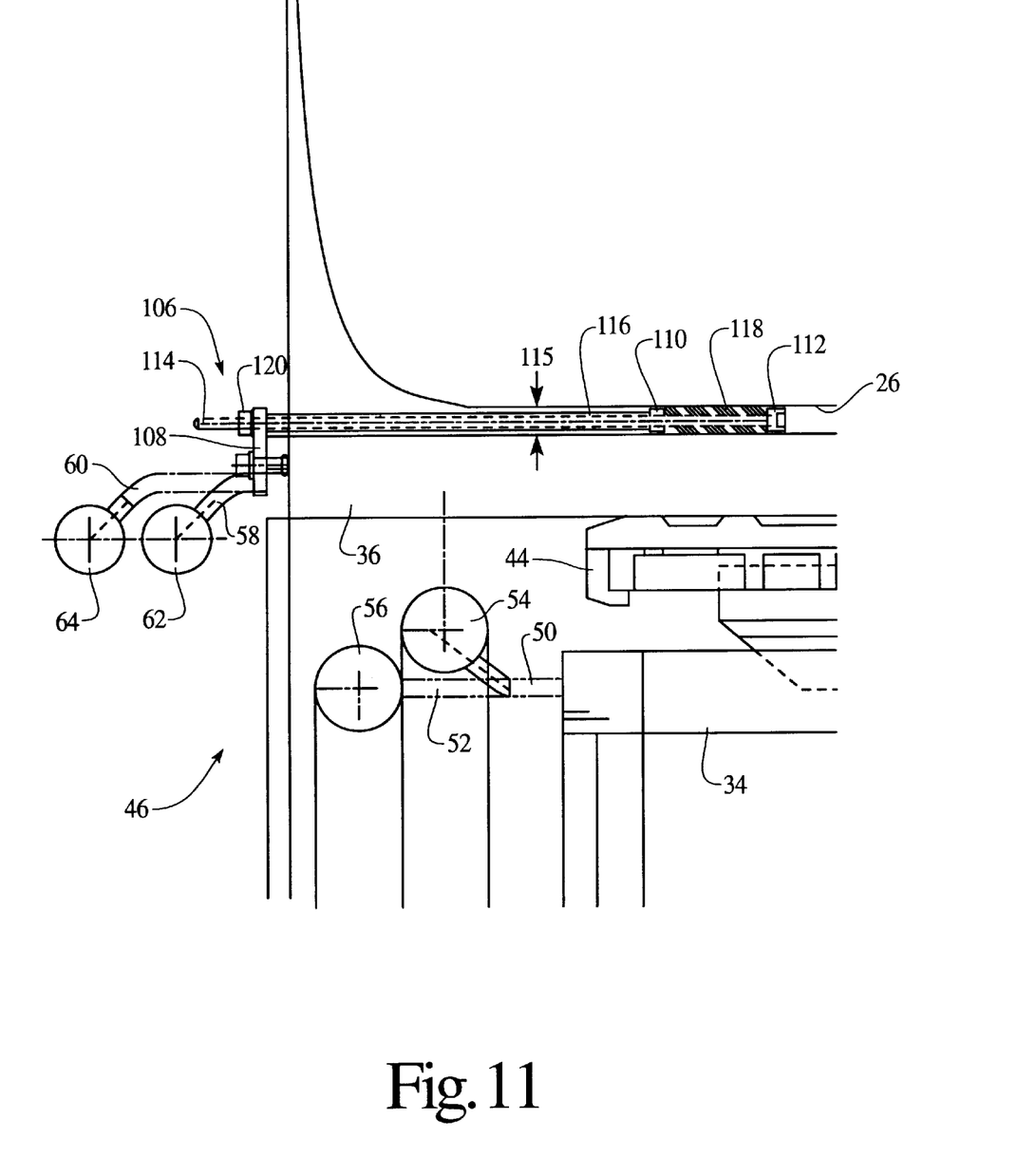
FIG. 11 is an enlarged side view of a service-end x and y-axis constraint for the gradient tube of FIG. 2.

The gradient tube assembly 30 includes a service-end 46 and a patient-end 48. A plurality of internal cooling tubes (not shown) or heat exchangers are potted within each of the primary and secondary gradient tubes 34, 36 proximate the respective primary and shielding gradient coils. As best shown in FIG. 11, each of the cooling tubes associated with the primary gradient coil 34 includes an inlet 50 and an outlet 52 extending from the service-end 46 of the primary gradient tube 34. The inlets 50 are joined to a single, circular, service-end coolant supply manifold or header 54. The outlets 52 are joined to a single, circular service-end coolant return manifold or header 56.

Likewise, each of the cooling tubes associated with the shielding gradient coil 36 includes an inlet 58 and an outlet 60 extending from the service-end 46 of the shielding gradient tube 36. The inlets 58 are joined to a single, circular, service-end coolant supply manifold or header 62. The outlets 60 are joined to a single, circular service-end coolant return manifold or header 64.

Referring again to FIGS. 2–4, an integral mounting appendage such as a tongue, extension, flange, or projection 66 is provided on the lower (i.e., six o'clock position) patient-end of the secondary gradient tube 36. The tongue 66 is formed from continuous glass filaments which extend integrally between the secondary gradient tube 36 and the mounting tongue 66 as a result of a filament winding process. That is, during manufacture, continuous glass filaments are wound around the secondary gradient tube 36 at a pitch or wrap angle α of approximately 60° prior to the potting step.

An arcuate portion 68 of the resulting patient-end of the secondary gradient tube is then machined away leaving only the tongue 66. As such, the tongue satisfies the high demands for structural strength and compact size. The tongue gains structural strength from the integral glass filaments. Further, the arcuate shape of the tongue provides high structural rigidity, and is well matched to the small available free space at the patient-end of the gradient tube 30.

Referring now to FIGS. 5–9, a "push-pull" type z-axis constraint 70 secures the integral tongue 66 to the patient-end of the main magnet housing 24. It should be appreciated that having a z-axis constraint only at the patient-end of the magnet bore (instead of conventional "push-push" mounting rings or tombstone mounts at both ends of the bore) permits free and needed space to be used at the service-end of the bore for water cooling (e.g., the headers 54, 56, 62, 64), electrical bus bar connections, etc.

The z-axis constraint 70 includes a saddle bracket 72, saddle cap 74, and an intermediate support bar 76. The saddle bracket 72 is secured to a weldment 78 by attachment means such as upper and lower sets of bolts 80, 82, respectively. The weldment 78 includes a bore plate 84 joined to the cylindrical member 26 by means such as welding, and a face plate 86 joined to the face of the housing 24 also by means such as welding. The saddle cap 74 is secured to the saddle bracket 72 and provides support for the front tunnel liner and/or the patient couch at the patient-end of the bore 12.

Figure 5:
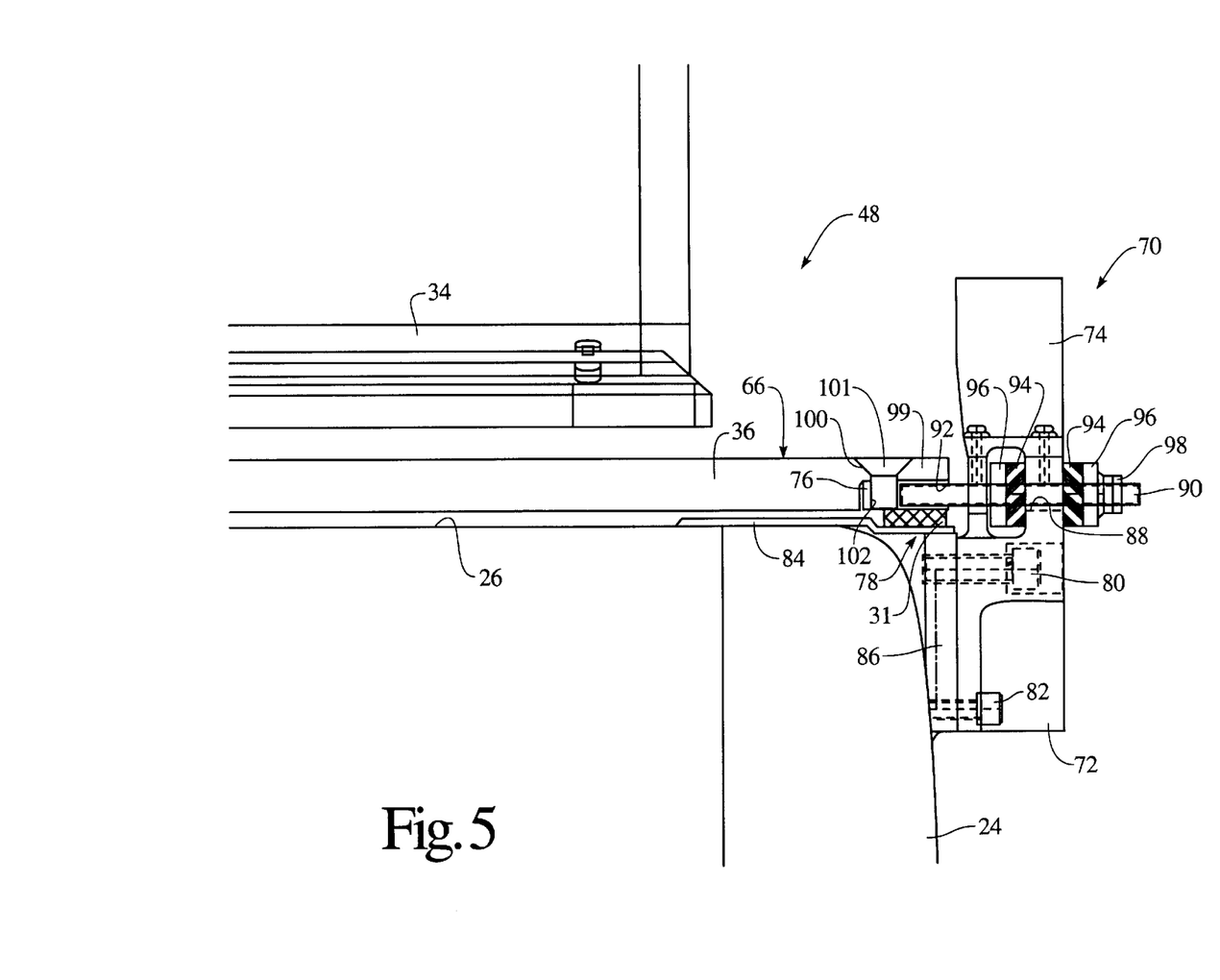
FIG. 5 is an enlarged side view of a z-axis constraint for the gradient tube of FIG. 2.
Figure 6:
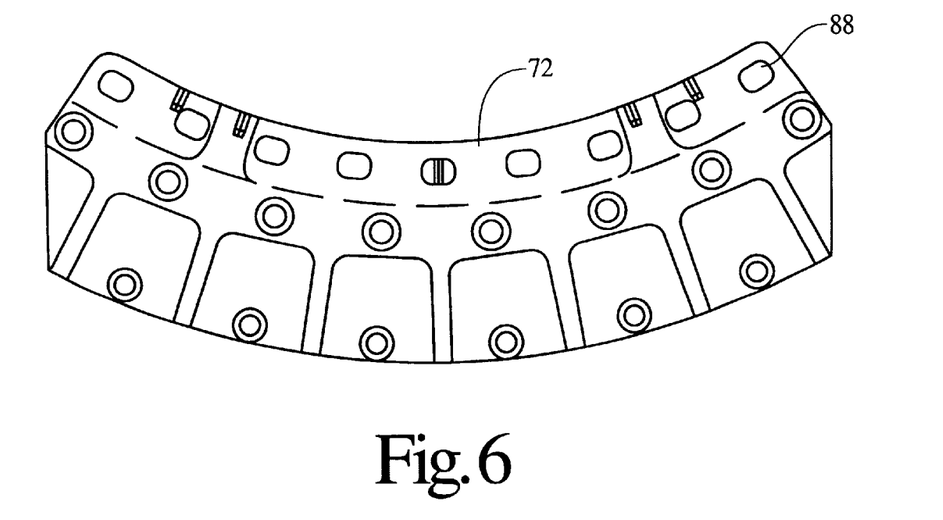
FIG. 6 is a side elevation view of a patient-end saddle bracket of the z-axis constraint of FIG. 5.
Figure 7:
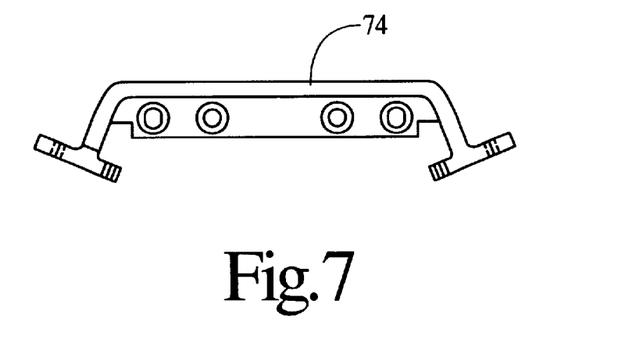
FIG. 7 is a side elevation view of a saddle cap of the z-axis constraint of FIG. 5.
Figure 8:
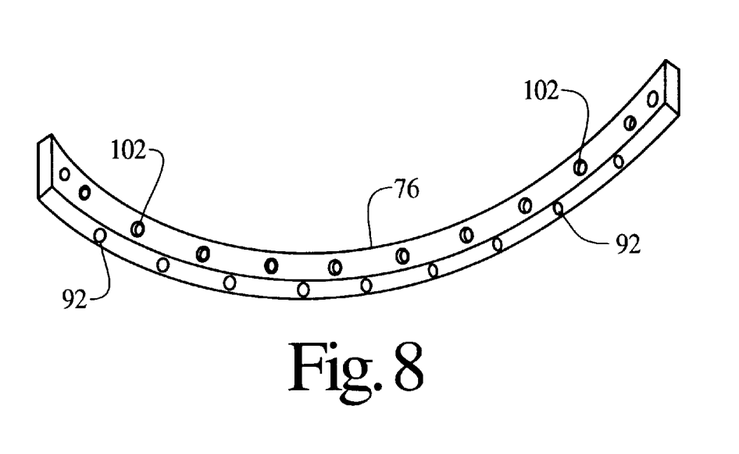
FIG. 8 is a perspective view of a support segment of the z-axis constraint of FIG. 5.
Figure 9:
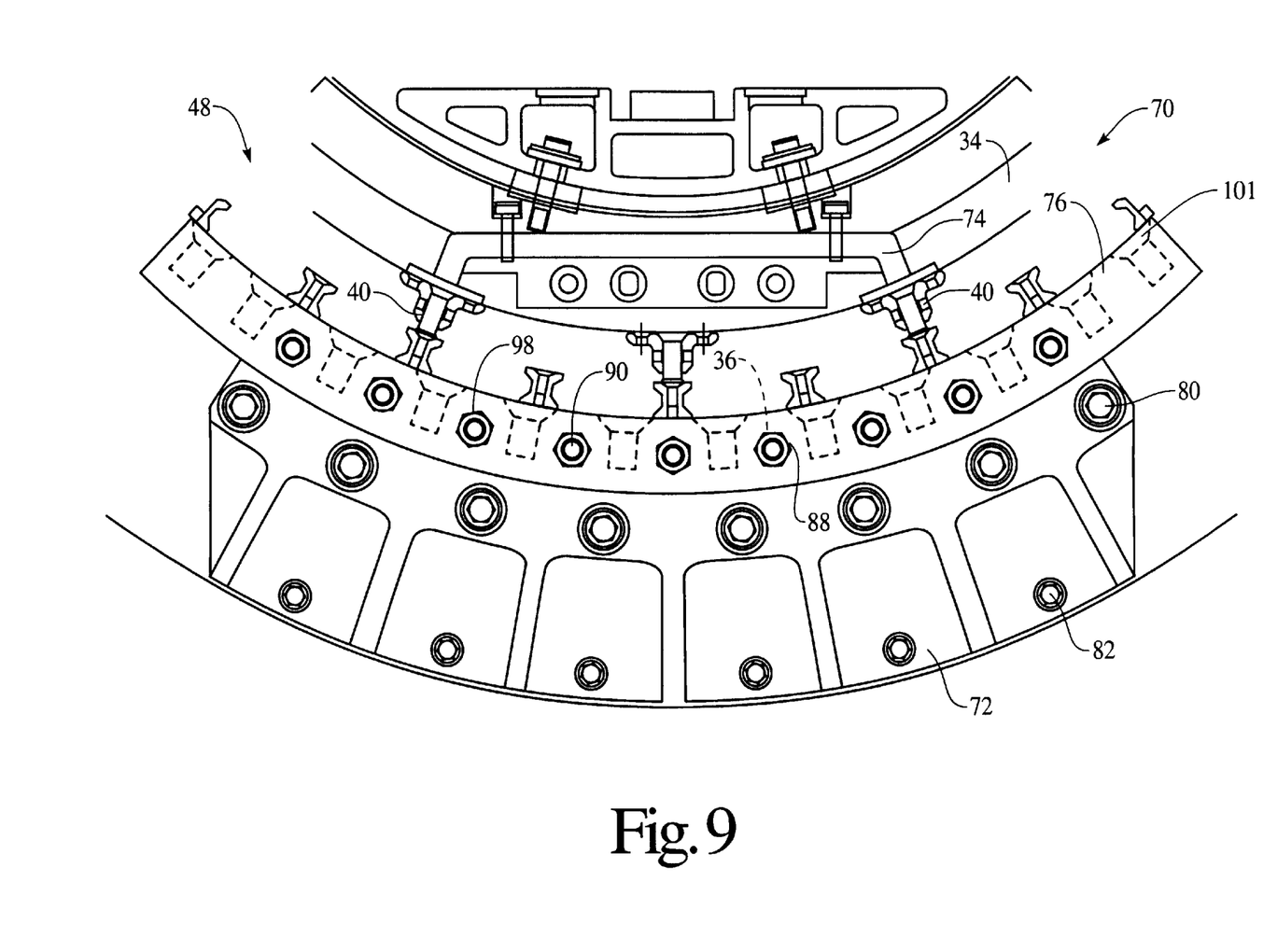
FIG. 9 is an end view of the gradient tube mounted to the z-axis constraint of FIG. 5.

The saddle bracket also includes a plurality of oval-shaped apertures 88 (FIG. 6) for receiving threaded rods 90 therethrough. The rods 90 and apertures are sized to prevent the rods from contacting the side walls of the apertures 88 during use. The rods 90 engage a first set of threaded apertures 92 of the intermediate support bar 76. The rods 90 are secured to the saddle bracket by elastomeric (e.g., urethane rubber) vibration isolators 94 to reduce vibration transmission from the gradient tube assembly to the magnet housing thus reducing the generation of structural borne noise. The isolators 94 are compressed against the saddle bracket 72 by means of backing plates 96 and a jam nut 98 associated with each treaded rod 90.

The tongue 66 includes a flanged portion 99 (FIG. 5) which extends over the intermediate support bar 76. A plurality of apertures 100 extend through the flange 99. Attachment means such as bolts or screws 101 pass through the apertures 100 and engage a second set of threaded apertures 102 of the intermediate support bar to secure the tongue 66, and hence the gradient tube assembly 30, to the intermediate support bar. It is contemplated that the rods 90 could be threaded directly into inserts mounted within the secondary gradient tube 36.

When the gradient tube assembly 30 is mounted to the magnet housing by the z-axis constraint 70, the rods 90 can then be adjusted to align or otherwise reposition the gradient tube assembly within the bore 12 in directions, for instance, along the z-axis.

Figure 10:
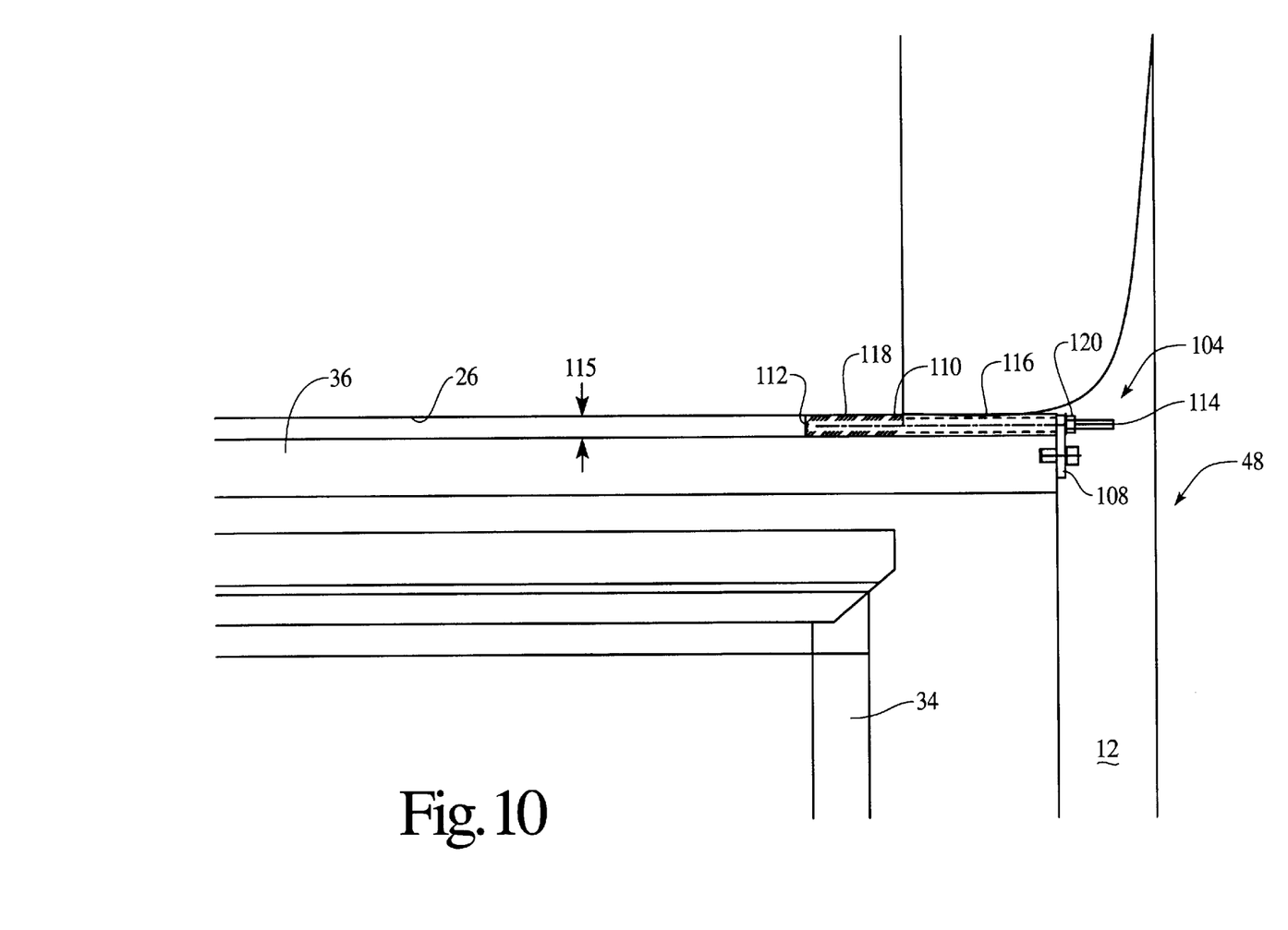
FIG. 10 is an enlarged side view of a patient-end x and y-axis constraint for the gradient tube of FIG. 2.
Figure 12:
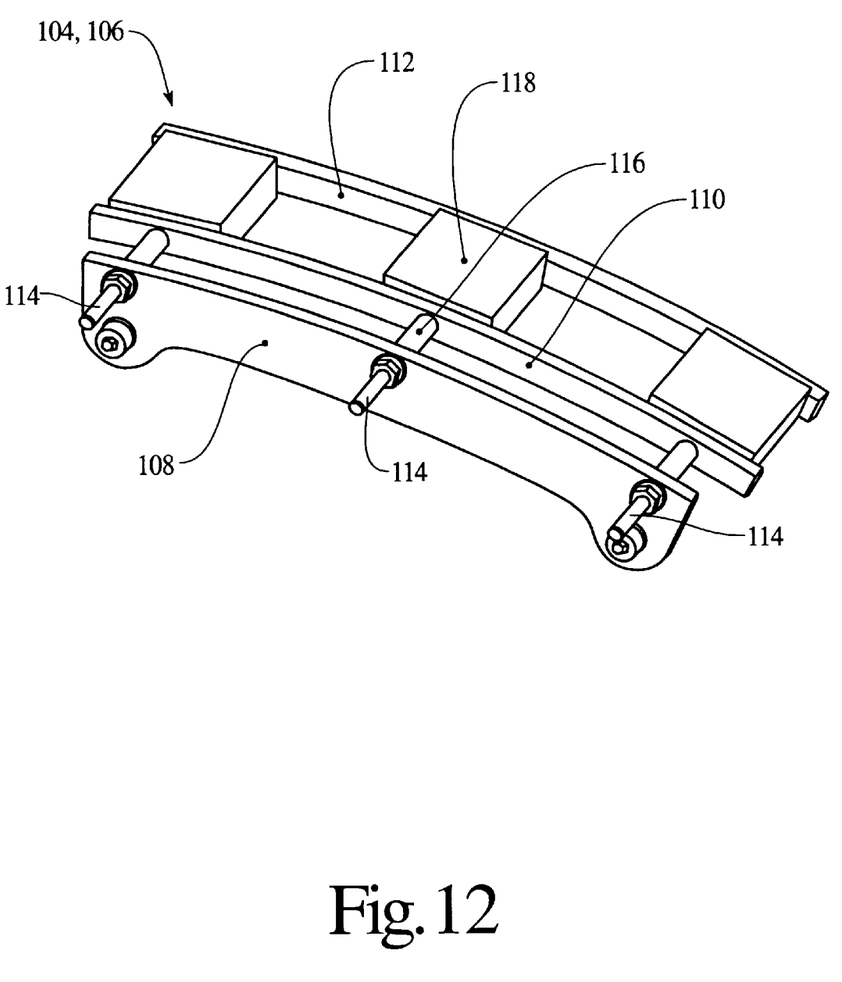
FIG. 12 is an enlarged perspective view of the patient and service-end x and y-axis constraints of FIGS. 10 and 11.

Referring now to FIGS. 10–12, patient-end 104 and service-end 106 x and y-axis constraints each include a support plate 108, a first or fixed bind plate 110, a second or movable bind plate 112, and at least one, and preferably, a plurality of threaded tyrods 114 extending through apertures in the support plate 108, and first and second bind plates 110, 112. The support plate 108 is secured to the respective patient or service-end face of the secondary gradient tube 36 while the bind plates 110, 112 extend in a gap 115 between the secondary gradient tube 36 and the cylindrical member 26. In a preferred embodiment, the x and y-axis constraints 104, 106 are positioned at approximately the twelve o'clock position.

The tyrods 114 extend through sleeves 116 interposed between the support plate 108 and the first bind plate 110. The tyrods 114 also extend through expandable elastomeric (e.g., urethane rubber) plugs 118 positioned between the first and second bind plates 110, 112. The free ends of the tyrods engage threaded apertures in the second bind plate 112. Thus, when the tyrods 114 are rotated in one direction, the second bind plate 112 is driven in a linear direction toward the first fixed bind plate 110 to compress the plug(s) along the z-axis. A stop (not shown) may be provided on the free end of each tyrod to prevent the tyrods from backing out of the second bind plate when turned in an opposite direction.

As a result, the plug(s) 118 expand in the x and/or y-directions to, in effect, wedge the plugs between the cylindrical member 26 and the outer surface of the secondary gradient tube 36. When expanded sufficiently, the plugs 118 frictionally constraint the gradient tube assembly 30 in directions along the x- and y-axis. A lock nut 120 binds each of the tyrods 114 to the support plate 108 to prevent inadvertent rotation of the tyrods. The plugs 118 also serve to reduce vibration transmission from the gradient tube assembly 30 to the magnet housing 24 to reduce the generation of structural borne noise.

It should be appreciated that the support plate 108, and the first and second bind plates 110, 112, each define arc segments which conform to cylindrical shape the annular gap 115. As the arc length of the plates and the number of plugs 118 are increased, the better the constraints 104, 106 are able to constraint the gradient tube assembly 30 in directions along the x and y-axis.

Figure 13:
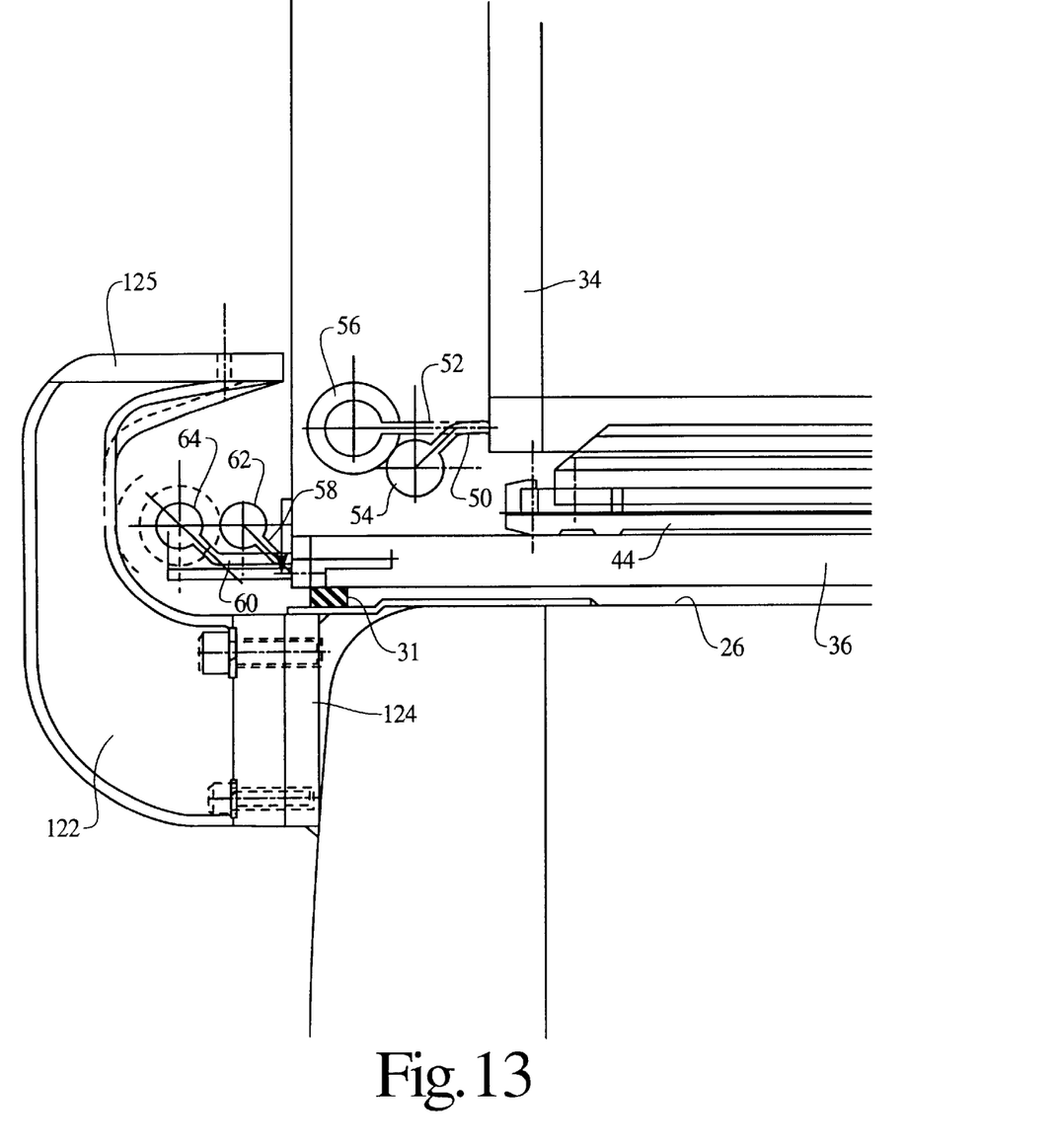
FIG. 13 is an enlarged side view of a service-end saddle bracket for the gradient tube of FIG. 2.

Referring to FIG. 13, there is shown a service-end saddle bracket 122 mounted to a weldment 124 attached to the service-end face of the magnet housing 24. An upper flange 125 of the bracket extends over the coolant headers 62, 64 to support the rear tunnel liner and patient couch at the service end of the bore 12.

Referring again to FIG. 1, a sequence control 130 controls a gradient coil control 132 and a transmitter 134. The gradient coil control 132 is connected to the x, y, and z-gradient coils associated with the gradient tube 30. The transmitter 134 is connected to the radio frequency coil associated with the radio frequency coil assembly 32 for generating pulses of radio frequency signals that excite and manipulate magnetic resonance in selected dipoles of a portion of a subject within the bore. A radio frequency receiver 138 is also connected to the radio frequency coil of the radio frequency coil assembly 32 to demodulate magnetic resonance signals emanating from the examined portion of the subject.

An image reconstruction processor 140, such as an inverse two-dimensional Fourier transform reconstruction processor, reconstructs the received magnetic resonance signals into an electronic image representation that is stored in an image memory 142. A video processor 144 converts electronic images stored in the memory 142 into appropriate format for display on a video monitor 146.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

For instance, the "push-pull" type z-axis constraint 70 could be positioned at the service-end 46 of the magnet housing, or z-axis constraints 70 could be positioned at both the patient and service-ends of the magnet housing. While this may crowd existing water cooling headers and electrical bus bar connections, it could have advantages for furthering patient or interventional access or new patient handling designs.

Further, the patient and service-end x and y-axis constraints could be positioned at other than the twelve o'clock positions, and the patient-end z-axis constraint could be positioned at other than the six o'clock position, as shown in the Figures.

Having thus described the preferred embodiments, the invention is now claimed to be:

1. A diagnostic imaging apparatus including a housing, a main field magnet for generating a temporally constant magnetic field through an examination region defined within a bore of the housing, and a gradient tube assembly adjustably positioned within the bore for inducing gradient magnetic fields across the temporally constant magnetic field, the gradient tube assembly including:
   at least one projection extending axially from a tubular body of the gradient tube assembly; and
   at least one mount for adjustably securing the at least one projection to the housing, said mount restraining the gradient tube assembly in a direction at least along a z-axis extending through the bore.

2. A magnetic resonance imaging apparatus including a housing, a main field magnet for generating a temporally constant magnetic field through an examination region defined within a bore of the housing, and a gradient tube assembly positioned within the bore for inducing gradient magnetic fields across the temporally constant magnetic field, the gradient tube assembly including:
   a primary gradient tube spaced radially inward from a secondary gradient tube;
   at least one extension being formed integral with and extending longitudinally from said secondary gradient tube; and
   at least one mount for securing the at least one extension to the housing, said mount restraining the gradient tube assembly in a direction at least along a longitudinal axis extending along the bore.

3. The apparatus of claim 1, wherein said projection extends from a patient-end of said gradient tube assembly.

4. A diagnostic imaging apparatus including a housing, a main field magnet for generating a temporally constant magnetic field through an examination region defined within a bore of the housing, and a gradient tube assembly positioned within the bore for inducing gradient magnetic fields across the temporally constant magnetic field, the gradient tube assembly including:
   at least one projecting member extending from the gradient tube assembly, said projecting member being formed from glass filaments wound around a tubular body of said gradient tube assembly, said filaments extending continuously from said gradient tube assembly to said projecting member; and
   at least one mount for securing the at least one projecting member to the housing.

5. A diagnostic imaging apparatus including a housing, a main field magnet for generating a temporally constant magnetic field through an examination region defined within a bore of the housing, and a gradient tube assembly positioned within the bore for inducing gradient magnetic fields across the temporally constant magnetic field, the gradient tube assembly including:
   at least one flange member extending from the gradient tube assembly; and
   at least one mount for securing the at least one flange member to the housing, said mount restraining the gradient tube assembly in a direction at least along a longitudinal axis of the bore, said mount securing said flange member to a lowermost portion of said bore at a patient-end thereof.

6. A diagnostic imaging apparatus including a housing, a main field magnet for generating a temporally constant magnetic field through an examination region defined within a bore of the housing, and a gradient tube assembly positioned within the bore for inducing gradient magnetic fields across the temporally constant magnetic field, the gradient tube assembly including:
   at least one mounting member formed integral with and extending longitudinally from the gradient tube assembly;
   at least one mount for securing the at least one mounting member to the housing, said mount restraining the gradient tube assembly in a direction at least along a longitudinal axis through the bore; and
   at least one vibration isolator interposed between said mounting member and said mount to reduce vibration transmission between said gradient tube assembly and the housing.

7. The apparatus of claim 1, further including at least one constraint interposed between the gradient tube assembly and a cylindrical housing member defining said bore to restrain the gradient tube assembly in a direction at least along one of a x-axis and a y-axis.

8. A diagnostic imaging apparatus including a housing, a main field magnet for generating a temporally constant magnetic field through an examination region defined within a bore of the housing, and a gradient tube assembly positioned within the bore for inducing gradient magnetic fields across the temporally constant magnetic field, the gradient tube assembly including:
   at least one longitudinally extending gradient tube mounting member;
   at least one housing mount for securing the at least one gradient tube mounting member to a patient-end of the housing, said housing mount restraining the gradient tube assembly in a longitudinal direction along the bore; and
   a first constraint positioned at a patient-end of said gradient tube assembly and a second constraint positioned at a service-end of said gradient tube assembly, at least one of the first constraint and the second constraint being interposed between the gradient tube assembly and a cylindrical housing member defining said bore to restrain the gradient tube assembly in at least one direction transverse to the longitudinal direction.

9. A diagnostic imaging apparatus including a housing, a main field magnet for generating a temporally constant magnetic field through an examination region defined within a bore of the housing, and a gradient tube assembly positioned within the bore for inducing gradient magnetic fields across the temporally constant magnetic field, the gradient tube assembly including:
   at least one extension member extending from the gradient tube assembly;
   at least one mount for securing the at least one extension member to the housing, said mount restraining the gradient tube assembly in a direction at least along a z-axis extending through the bore; and
   at least one constraint interposed between the gradient tube assembly and a cylindrical housing member defining said bore to restrain the gradient tube assembly in a direction at least along one of a x-axis and a y-axis, said constraint being positioned at a twelve o'clock position at one of a patient-end and a service-end of said gradient tube assembly.

10. A diagnostic imaging apparatus including a housing, a main field magnet for generating a temporally constant magnetic field through an examination region defined within a bore of the housing, and a gradient tube assembly positioned within the bore for inducing gradient magnetic fields across the temporally constant magnetic field, the gradient tube assembly including:

at least one longitudinally extending flange member;

at least one mount for securing the at least one flange member to the housing, said mount restraining the gradient tube assembly at least in a longitudinal direction along a z-axis extending through the bore; and at least one constraint interposed between the gradient tube assembly and a cylindrical housing member defining said bore to restrain the gradient tube assembly in a direction at least along one of a x-axis and a y-axis, said constraint including at least one elastomeric plug and means for expanding said plug in directions at least along one of the x-axis and the y-axis.

11. A diagnostic imaging apparatus including a housing, a main field magnet for generating a temporally constant magnetic field through an examination region defined within a bore of the housing, and a gradient tube assembly positioned within the bore for inducing gradient magnetic fields across the temporally constant magnetic field, the gradient tube assembly including:

at least one projection extending from the gradient tube assembly; and at least one mount for securing the at least one projection to the housing, said mount restraining the gradient tube assembly at least along a longitudinal axis of the bore, and said mount including a means for adjustably positioning the gradient tube assembly along the longitudinal axis.

12. The apparatus of claim 1, wherein said mount restrains the gradient tube assembly in both directions along the z-axis.

13. A method of securing a gradient tube assembly to a housing of a diagnostic imaging apparatus, the gradient tube assembly being positioned within a bore of the housing, the method including:

providing the gradient tube assembly with a projection that is formed integral with and that extends axially from a tubular body portion of the gradient tube assembly; and attaching the projection to a mount associated with the housing to restrain the gradient tube assembly at least in a direction axially along the bore.

14. The method of claim 13, wherein the attaching step includes the steps of:

attaching the projection to an intermediate support bar; and attaching the intermediate support bar to the mount.

15. A method of securing a gradient tube assembly within a bore of a magnetic resonance imaging apparatus, the method including:

providing the gradient tube assembly with a longitudinally extending flange member formed integral therewith; and attaching the flange member to a mount at a patient-end of the housing to restrain the gradient tube assembly at least in a longitudinal direction of the bore.

16. A method of securing a gradient tube assembly to a housing of a diagnostic imaging apparatus, the gradient tube assembly being positioned within a bore of the housing, the method including:

providing the gradient tube assembly with an integral projection that extends axially from the gradient tube assembly; and attaching the projection to the mount at a lowermost portion of the bore to restrain the gradient tube assembly in a direction at least along a z-axis extending through the bore.

17. The method of claim 13, further including the step of:

restraining the gradient tube assembly in a direction at least along one of a x-axis and a y-axis.

18. A method of securing a gradient tube assembly to a housing of a diagnostic imaging apparatus, the gradient tube assembly being positioned within a bore of the housing, the method including:

attaching a longitudinally extending flange member of the gradient tube assembly to a mount associated with the housing to restrain the gradient tube assembly in a direction at least along a z-axis extending through the bore;

positioning at least one elastomeric plug between the gradient tube assembly and a cylindrical housing member defining the bore; and expanding the plug in a direction at least along one of a x-axis and a y-axis to restrain the gradient tube assembly in a direction at least along one of the x-axis and the y-axis.

19. The method of claim 18, wherein the positioning step includes the step of:

positioning the elastomeric plug between the gradient tube assembly and the cylindrical housing member proximate at least one of a patient-end and a service-end of the housing.

20. The method of claim 18, wherein the positioning step includes the step of:

positioning the elastomeric plug between the gradient tube assembly and the cylindrical housing member proximate an uppermost portion of the gradient tube assembly.

21. A method of securing a gradient tube assembly to a housing of a diagnostic imaging apparatus, the gradient tube assembly being positioned within a bore of the housing, the method including:

positioning the gradient tube assembly in the bore with a projection that extends axially therefrom;

attaching the projection to a mount associated with the housing to restrain the gradient tube assembly in a direction at least along a longitudinal axis of the bore; and adjusting the position of the gradient tube assembly in along the longitudinal axis after the attaching step.

22. The apparatus of claim 1 further including:

at least one vibration isolator disposed betweem the bore and the gradient tube for restraining at least one of transverse and vertical movement and reducing vibration transmission between the gradient tube and the bore.

* * * * *